US010367349B2

(12) United States Patent
de Raad

(10) Patent No.: US 10,367,349 B2
(45) Date of Patent: Jul. 30, 2019

(54) ELECTROSTATIC DISCHARGE (ESD) PROTECTION DEVICE AND METHOD FOR OPERATING AN ESD PROTECTION DEVICE

(71) Applicant: NXP B.V., Eindhoven (NL)

(72) Inventor: Gijs de Raad, Bemmel (NL)

(73) Assignee: NXP B.V., Eindhoven (NL)

( * ) Notice: Subject to any disclaimer, the term of this patent is extended or adjusted under 35 U.S.C. 154(b) by 266 days.

(21) Appl. No.: 15/476,276

(22) Filed: Mar. 31, 2017

(65) Prior Publication Data

US 2018/0287376 A1    Oct. 4, 2018

(51) Int. Cl.
*H02H 9/04* (2006.01)
*H01L 27/02* (2006.01)
*H03K 19/003* (2006.01)
*H01L 27/06* (2006.01)
*H01L 49/02* (2006.01)

(52) U.S. Cl.
CPC .............. *H02H 9/04* (2013.01); *H01L 27/027* (2013.01); *H01L 27/0248* (2013.01); *H01L 27/0285* (2013.01); *H01L 27/0629* (2013.01); *H01L 28/20* (2013.01); *H01L 28/40* (2013.01); *H02H 9/046* (2013.01); *H03K 19/00315* (2013.01)

(58) Field of Classification Search
CPC .............. H01L 27/0248; H01L 27/0629; H01L 27/027; H01L 27/0285; H01L 28/20; H01L 28/40; H03K 19/00315; H02H 9/04; H02H 9/046
USPC .......................................................... 361/56
See application file for complete search history.

(56) References Cited

U.S. PATENT DOCUMENTS

| 5,982,600 | A  | 11/1999 | Cheng |
| 7,068,482 | B2 | 6/2006  | Chen |
| 7,323,752 | B2 | 1/2008  | Chu et al. |
| 9,331,067 | B2 | 5/2016  | de Raad |
| 2002/0153570 | A1 | 10/2002 | Lin et al. |
| 2003/0026054 | A1 | 2/2003  | Hulfachor et al. |
| 2003/0076639 | A1 | 4/2003  | Chen |
| 2003/0076645 | A1 | 4/2003  | Ker et al. |
| 2004/0051146 | A1 | 3/2004  | Ker et al. |
| 2004/0179314 | A1 | 9/2004  | Chen |

(Continued)

FOREIGN PATENT DOCUMENTS

| JP | 2011114056 A | 6/2011 |
| JP | 2011176091 A | 9/2011 |

OTHER PUBLICATIONS

Duwury, Charvaka et al.; "Substrate Pump NMOS for ESD Protection Applications"; Electrical Overstress/Electrostatic Discharge Symposium Proceedings 2000; p. 1-11; 2000.

(Continued)

*Primary Examiner* — Kevin J Comber

(57) ABSTRACT

Embodiments of an electrostatic discharge (ESD) protection device and a method of operating an ESD protection device are described. In one embodiment, an ESD protection device includes an NMOS transistor configured to shunt current in response to an ESD pulse and a bigFET connected in parallel with the NMOS transistor. The NMOS transistor includes a source terminal, a gate terminal, and a body. The gate terminal and the body of the NMOS transistor are connected to the source terminal via a resistor. Other embodiments are also described.

16 Claims, 7 Drawing Sheets

(56) References Cited

U.S. PATENT DOCUMENTS

| | | |
|---|---|---|
| 2005/0285657 A1* | 12/2005 | Watt .................... H01L 27/0274 327/313 |
| 2006/0001100 A1 | 1/2006 | Kamei et al. |
| 2006/0044714 A1 | 3/2006 | Chen |
| 2007/0069310 A1 | 3/2007 | Song et al. |
| 2007/0103826 A1 | 5/2007 | Hung et al. |
| 2008/0151446 A1 | 6/2008 | Ker et al. |
| 2008/0278872 A1 | 11/2008 | Wang et al. |
| 2009/0073620 A1 | 3/2009 | Mergens et al. |
| 2009/0086391 A1 | 4/2009 | Gauthier, Jr. et al. |
| 2009/0089719 A1 | 4/2009 | Gauthier, Jr. et al. |
| 2009/0261417 A1 | 10/2009 | Jou et al. |
| 2010/0103570 A1 | 4/2010 | Song et al. |
| 2010/0142105 A1 | 6/2010 | Linten et al. |
| 2010/0148266 A1 | 6/2010 | Foley et al. |
| 2010/0296212 A1 | 11/2010 | Liang et al. |
| 2010/0321841 A1 | 12/2010 | Worley et al. |
| 2012/0008243 A1 | 1/2012 | Huitsing et al. |
| 2012/0069479 A1 | 3/2012 | Lee |
| 2012/0236444 A1 | 9/2012 | Srivastava et al. |
| 2013/0128400 A1 | 5/2013 | Yeh |
| 2014/0160604 A1 | 6/2014 | Lai et al. |
| 2015/0084161 A1 | 3/2015 | Worley et al. |
| 2016/0013638 A1 | 1/2016 | Glas et al. |

OTHER PUBLICATIONS

European Search Report, 14180740, dated Jun. 26, 2015.

* cited by examiner

ELECTROSTATIC DISCHARGE (ESD) PROTECTION DEVICE AND METHOD FOR OPERATING AN ESD PROTECTION DEVICE

Embodiments of the invention relate generally to electronic hardware and methods for operating electronic hardware, and, more particularly, to electrostatic discharge (ESD) protection devices and methods for operating an ESD protection device.

An ESD protection device can be integrated into an integrated circuit (IC) chip to provide a low impedance channel to ground to protect against thermal damage in the IC substrate. During a regular ESD strike or an ESD test, such as a human-body-model (HBM) test or a machine-model (MM) test, an ESD protection device typically shunts a current pulse with a peak value of 1 or 2 ampere (A). In contrast to HBM and MM pulses, a so-called "system-level ESD pulse," such as an ESD pulse described in the International Electrotechnical Commission (IEC)-61000-4-2 standard, can have a first peak as high as 30 A, lasting about 1 nanosecond (ns), followed by a second peak as high as 16 A, lasting about 150 ns. In the case that a system-level ESD pulse or a part thereof is conducted through a conventional ESD protection device, there is a risk that the ESD protection device has to sink a significantly higher ESD current pulse than the device is designed to sink. This may result in physical damage to the ESD protection device itself, to the core circuit that is protected by the ESD protection device, or to both. Therefore, there is a need for a ESD protection device that provides protection against regular ESD pulses with low peak current, and also provides protection against system-level ESD pulses with a much higher peak current as part of a larger protection network that can be implemented on an IC, substrate (e.g., a printed circuit board (PCB)), or a combination thereof.

SUMMARY

Embodiments of an electrostatic discharge (ESD) protection device and a method of operating an ESD protection device are described. In one embodiment, an ESD protection device includes an NMOS transistor configured to shunt current in response to an ESD pulse and a bigFET connected in parallel with the NMOS transistor. The NMOS transistor includes a source terminal, a gate terminal, and a body. The gate terminal and the body of the NMOS transistor are connected to the source terminal via a resistor. Other embodiments are also described.

In an embodiment, the NMOS transistor and the bigFET are both connected between first and second nodes through which the ESD pulse is received.

In an embodiment, the NMOS transistor further includes a drain terminal connected to the first node, and the source terminal is connected to the second node.

In an embodiment, the resistor is connected to the second node.

In an embodiment, the ESD pulse includes a first current peak and a subsequent second current peak that is lower than the first current peak. The NMOS transistor is configured to shunt the current during the first peak of the ESD pulse.

In an embodiment, the bigFET is configured to conduct ESD current during the second peak of the ESD pulse.

In an embodiment, the NMOS transistor further includes a silicide block mask. The silicide block mask extends less than a predefined length from the gate terminal to a drain region of the NMOS transistor.

In an embodiment, the predefined length is 1 µm.

In an embodiment, the ESD protection device further includes a trigger device connected between the first and second nodes and configured to trigger a gate terminal of the bigFET in response to the ESD pulse.

In an embodiment, the ESD protection device further includes a decoupling capacitor connected in parallel with the NMOS transistor.

In an embodiment, an IC device includes the ESD protection device and a device to be protected connected in parallel with the ESD protection device.

In an embodiment, an ESD protection device includes an NMOS transistor configured to shunt current in response to an ESD pulse, a bigFET connected in parallel with the NMOS transistor, and a trigger device configured to trigger a gate terminal of the bigFET in response to the ESD pulse. The NMOS transistor includes a source terminal, a gate terminal and a body. The gate terminal and the body of the NMOS transistor are connected to the source terminal via a resistor. The source terminal and the resistor are connected to ground.

In an embodiment, the NMOS transistor and the bigFET are both connected between first and second nodes through which the ESD pulse is received.

In an embodiment, the NMOS transistor further includes a drain terminal connected to the first node. The source terminal is connected to the second node.

In an embodiment, the ESD pulse includes a first current peak and a subsequent second current peak that is lower than the first current peak. The NMOS transistor is configured to shunt the current during the first peak of the ESD pulse. The bigFET is configured to conduct ESD current during the second peak of the ESD pulse.

In an embodiment, the bigFET is configured to conduct ESD current during the second peak of the ESD pulse.

In an embodiment, the NMOS transistor further includes a silicide block mask. The silicide block mask extends less than a predefined length from the gate terminal to a drain region of the NMOS transistor.

In an embodiment, the predefined length is 1 µm.

In an embodiment, the ESD protection device further includes a decoupling capacitor connected in parallel with the NMOS transistor.

In an embodiment, a method for operating an ESD protection device conducting a first peak of an ESD pulse using an NMOS transistor of the ESD protection device and conducting a second peak of the ESD pulse using a bigFET of the ESD protection device that is connected in parallel with the NMOS transistor.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
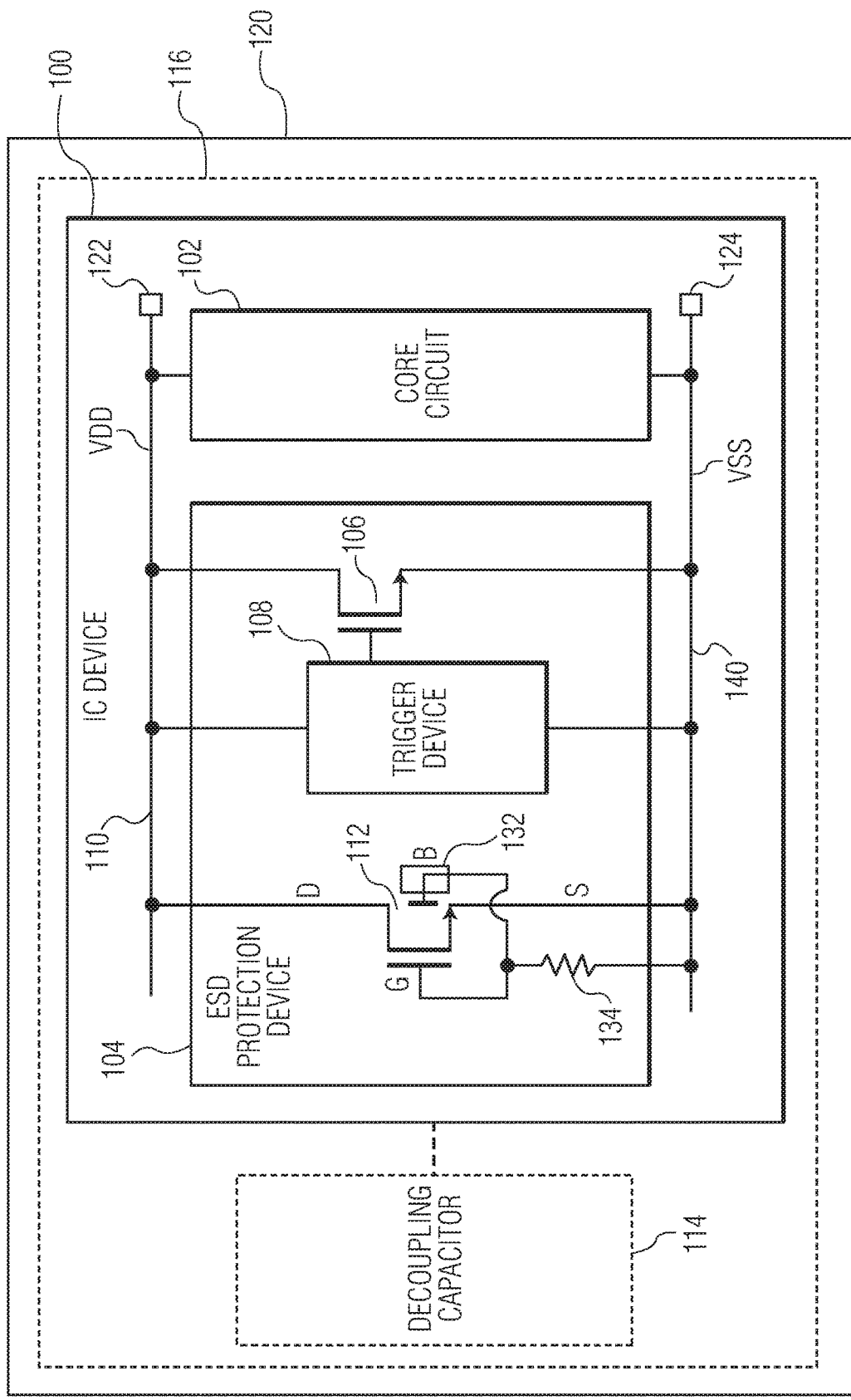
FIG. 1 is a schematic block diagram of a circuit in accordance with an embodiment of the invention.

FIG. 1 is a schematic block diagram of a circuit 120 in accordance with an embodiment of the invention. The circuit can be used in various applications, such as automotive applications, communications applications, industrial applications, medical applications, computer applications, and/or consumer or appliance applications. In the embodiment depicted in FIG. 1, the circuit includes an IC device 100, which includes a core circuit 102 and an ESD protection device 104 that is used to protect the core circuit during an ESD event, which may be an ESD test or an actual ESD strike. The IC device can be implemented in a substrate, such as a semiconductor wafer or a printed circuit board (PCB). In an embodiment, the IC device is packaged as a semiconductor IC chip. The IC device may be included in a microcontroller, which can be used for, for example, in vehicle control or communications, identification, wireless communications, and/or lighting control. In some embodiments, the IC device is included in a computing device, such as a smartphone, a tablet computer, a laptop, etc. For example, the IC device may be included in a Near Field Communications (NFC) capable computing device. Although the circuit is shown in FIG. 1 as including the core circuit and the ESD protection device, in other embodiments, the circuit may include additional circuit elements. For example, the circuit may include a control circuit that is located in a low voltage domain and used to control the core circuit that is located in a high voltage domain.

In the embodiment depicted in FIG. 1, the core circuit and the ESD protection device are connected to first and second nodes 122, 124 through which an ESD pulse may be received. The first and second nodes may be coupled to different voltages. In some embodiments, the first node 122 is connected to a positive voltage and the second node 124 is connected to the ground or a voltage that is lower than the voltage at the first node. In an embodiment, the first and second nodes are electrical terminals of the IC device, such as electrical contact pads or electrical contact pins of the IC device.

The core circuit 102 is a device to be protected by the ESD protection device 104 in case of an ESD event. The core circuit typically includes one or more internal circuit components that are susceptible to ESD strikes. Examples of the core circuit include, but are not limited to, microcontrollers, transceivers, and switching circuits. In an embodiment, the core circuit includes a power supply domain of the IC device 100. For example, the core circuit may be connected to a power supply rail 110 with a supply voltage, "$V_{DD}$," of the IC device 100 and a voltage rail 140 with a lower voltage, "$V_{SS}$." In some embodiments, the voltage rail 140 is connected to ground. Although the IC device is shown in FIG. 1 as including the core circuit and the ESD protection device 104, in other embodiments, the IC device may include additional circuit elements. For example, the IC device may include serially connected diodes that are coupled in parallel with the core circuit for current restriction and voltage surge protection.

The ESD protection device 104 protects the core circuit 102 during an ESD event. The ESD protection device can be used to protect a power supply domain of the IC device 100. For example, the ESD protection device may be connected to the power supply rail, "$V_{DD}$," of the IC device 100. The ESD protection device can be implemented by suitable semiconductor devices. In the embodiment depicted in FIG. 1, the ESD protection device includes an NMOS transistor 112, a big field-effect transistor (bigFET) 106 connected in parallel with the NMOS transistor, and a trigger device 108. Although the ESD protection device is shown in FIG. 1 as including the bigFET, the trigger device, and the NMOS transistor, in other embodiments, the electrical device may include additional circuit elements. For example, the ESD protection device may include one or more additional transistors and/or resistors.

The NMOS transistor 112 of the ESD protection device 104 is configured to shunt current in response to an ESD pulse. In the embodiment depicted in FIG. 1, the NMOS transistor includes a source terminal, "S," a gate terminal, "G," a body, "B," 132, and a drain terminal, "D." The gate terminal, G, and the body, B, of the NMOS transistor are connected to the source terminal, S, of the NMOS transistor via a resistor 134. In some embodiments, the drain terminal, D, of the NMOS transistor is electrically connected to the first node 122 and the source terminal, S, of the NMOS transistor is electrically connected to the second node 124. The resistor may be also electrically connected to the second node. In some embodiments, the source terminal, S, of the NMOS transistor and the resistor are connected to ground.

The bigFET 106 of the ESD protection device 104 is configured to conduct current during an ESD event. In some embodiments, the bigFET is an NMOS device (e.g., an NMOS transistor) with a large channel width to sink ESD current. A bigFET can be used to protect a power supply domain of the IC device 100 from overvoltage during an ESD event by shunting the ESD current from the power supply domain to the ground domain (i.e., the ground). The channel width of a bigFET can be chosen to ensure that the voltage drop across the bigFET during an ESD event does not exceed a predetermined voltage, which may be harmful to the inner circuit components (e.g., the core circuit 102) of the IC device. In some embodiments, the channel width of the bigFET is chosen such that the ESD current caused by an ESD event flows through the bigFET while keeping the voltage drop generated across the bigFET below a predetermined value, which can be set to a value between 50% and 150% of the nominal value of $V_{DD}$. The predetermined voltage is typically set to be equal to or around (e.g., ±30%) the power supply voltage of the IC device. In some embodiments, the ESD pulse includes a first current peak and a subsequent second current peak that is lower than the first current peak. In these embodiments, the NMOS transistor is configured to shunt the current during the first peak of the ESD pulse while the bigFET is configured to conduct ESD current during the second peak of the ESD pulse.

The trigger device 108 of the ESD protection device 104 is configured to detect an ESD event and to drive the bigFET 106 for a certain amount of time during an ESD event. In some embodiments, the trigger device is connected between the first and second nodes 122, 124 and configured to trigger the gate terminal, "G," of the bigFET (e.g., by applying an appropriate voltage to the gate terminal, G, of the bigFET) in response to an ESD pulse. The trigger device can be implemented using one or more capacitors, transistors, and/or resistors. In some embodiments, the trigger device is similar to or the same as trigger devices described in U.S. Pat. No. 9,153,958, titled "Bias-Insensitive Trigger Circuit for BigFET ESD Supply Protection." In an embodiment, the trigger device 108 includes a slew rate detector, an optional pre-driver stage, a keep-on latch, and a driver stage. However, in other embodiments, the trigger device may include more or less components to implement more or less functionalities. The slew rate detector is a circuit that is configured to detect an ESD event, which may be an ESD test or an actual ESD strike, for example, by detecting a rise in the power supply voltage, "$V_{DD}$," of the IC device 100, which is characteristic of an ESD event. The pre-driver stage is a circuit that is configured to turn on the driver stage once an ESD event is detected by the slew rate detector. The pre-driver stage may only be active during the initial detection of an ESD event to "trigger" the driver stage. The keep-on latch is a circuit that is configured to keep the driver stage turned on for the expected maximum duration of the detected ESD event. In some embodiments, the functions of the slew rate detector and the keep-on latch are implemented in a single circuit. The driver stage is a circuit that is configured to drive the gate terminal of the bigFET. In some embodiments, a combination of the bigFET and the trigger device is referred to as a "railclamp.". A railclamp can be used to protect a supply domain of an IC chip from overheating during an ESD strike by shunting the ESD current from the supply domain to the ground domain. In combination with diodes, a railclamp can also be used to protect non-supply pins such as inputs, outputs, or combined input/output pins (IOs).

In some embodiments, the circuit 120 includes a decoupling capacitor 114 located on a substrate 116, such as a Printed Circuit Board (PCB), of the circuit 120. The decoupling capacitor may be connected in parallel with the NMOS transistor. In some embodiments, the decoupling capacitor is physically attached and in physical and electrical contact with the substrate. The primary purpose of the decoupling capacitor is to suppress ripple on the supply voltage during normal operation. The decoupling capacitor can be used with the ESD protection device 104 of the IC device 100 for robustness against system-level ESD pulses. For example, the ESD protection device inside the IC device shunts a small portion of the system-level ESD current, and the decoupling capacitor stores the rest of the ESD pulse at a voltage that is lower than the threshold voltage of the IC.

Figure 2:
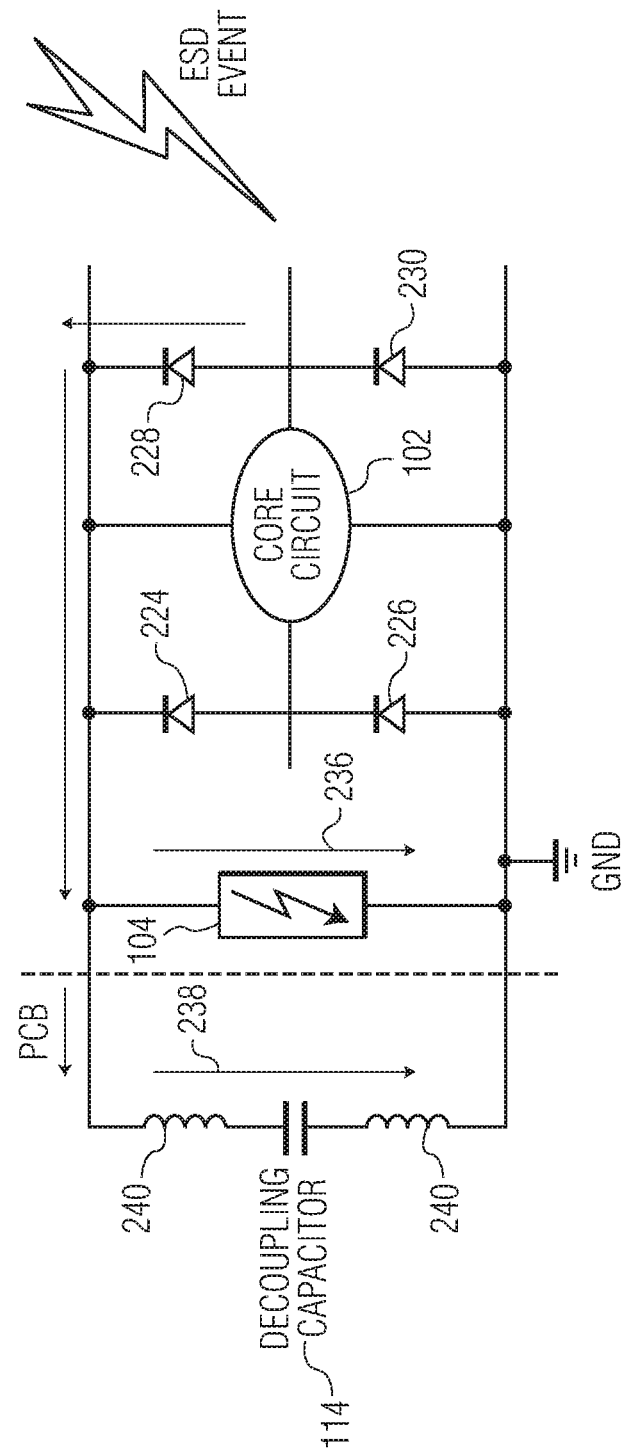
FIG. 2 illustrates an example of the ESD current paths of the circuit depicted in FIG. 1 during an ESD event.

FIG. 2 illustrates an example of ESD current paths through the ESD protection device 104 and the decoupling capacitor 114 of the circuit 120 during an ESD event. In FIG. 2, a dashed line separates elements on a substrate, such as a printed circuit board (PCB), with elements on an IC chip. In particular, the decoupling capacitor is located on one side of the substrate while the ESD protection device 104 and the core circuit 102 are located on the other side of the substrate. The ESD event may cause a system-level ESD pulse with a high peak current or a regular ESD pulse with a low peak current. In the embodiment depicted in FIG. 2, serially connected diodes 224, 226 and 228, 230 are connected in parallel with the core circuit for current restriction and voltage surge protection purpose.

Figure 3:
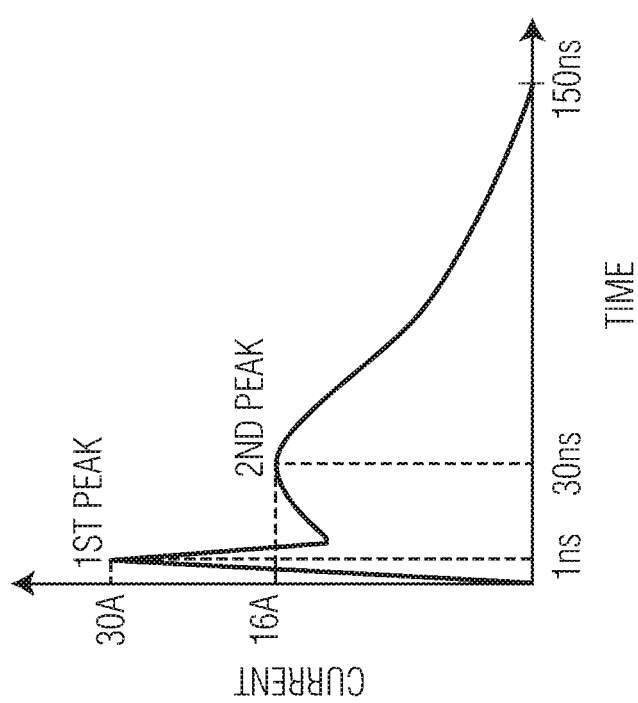
FIG. 3 depicts an example of a system-level ESD pulse.

FIG. 3 depicts an example of a system-level ESD pulse that can be conducted through the ESD current paths of FIG. 2. As depicted in FIG. 3, the system-level ESD pulse includes a first current peak and a second current peak that is lower than the first current peak. For example, the system-level ESD pulse may have a first peak of about 30 Ampere (A) occurring about 1 ns into the pulse, followed by a second peak of 16 A occurring at around 30 ns, and a duration of around 150 ns.

Turning back to FIG. 2, the decoupling capacitor 114 not only has a certain capacitance but also has some parasitic inductance represented as inductors 240, as shown in FIG. 2. The consequence of the decoupling capacitor having both a capacitance and an inductance is that the decoupling capacitor may absorb only the second peak of a system-level ESD pulse (e.g., an IEC61000-4-2 pulse), as illustrated by arrow 238, and force the first peak of the system-level pulse through the ESD protection device 104 incorporated in the IC device 100, as illustrated by arrow 236. A bigFET based ESD protection device is typically designed to sink a current of a few Amperes (A). However, a first current peak of a system-level ESD pulse, which may be as strong as 30 A, can damage the bigFET based ESD protection device and ruin the core circuit. To accommodate a bigFET based ESD protection device, the negative effect of the parasitic inductance of the decoupling capacitor can be addressed by placing tight constraints on the PCB design and choosing a capacitor with minimal parasitic inductance. For example, a smaller decoupling capacitor with a low value of parasitic inductance can be used in parallel with a main decoupling capacitor. However, two capacitors with different characteristics are more expensive than a one-capacitor solution.

Alternatively, a capacitor with a relatively low inductance can be used as the decoupling capacitor. However, a capacitor with a relatively low inductance is more expensive to manufacture than a capacitor with higher inductance. In another example, a transient voltage suppressor (TVS) can be placed in parallel with the decoupling capacitor on the PCB. However, the addition of a TVS can lead to more stringent design constraints for the PCB layout and increased system cost. In addition, a TVS may not respond fast enough to fully protect against the first peak of a system-level ESD pulse. Compared to a conventional bigFET based ESD protection device that is capable of sinking a current of around 2 A during a regular ESD event, the ESD protection device 104 depicted in FIG. 1 can absorb or shunt the first current peak of a system-level ESD pulse, which may be as strong as 30 A. The second current peak of the system-level pulse, which is generally lower than the first current peak of the system-level pulse, can be absorbed by the bigFET 106 and the decoupling capacitor 114. In particular, the NMOS transistor 112 handles the first peak of the system-level ESD pulse. By the time the first peak of the system-level ESD pulse has passed and the second peak of the system-level ESD pulse arrives, the decoupling capacitor and the bigFET 106 together sink or store the ESD current in the second peak. The bigFET and the decoupling capacitor keep the voltage below the threshold voltage of the NMOS transistor as the bigFET and the decoupling capacitor sink or store the second peak current of the system-level ESD pulse. Consequently, the ESD protection device described with reference to FIGS. 1 and 2 can be used with a decoupling capacitor with a relatively large inductance and the constraints that otherwise exist for the PCB design or the choice of capacitor types can be relaxed. The ESD protection device depicted in FIG. 1 can be used with the decoupling capacitor to form an economical and compact ESD protection network against system-level ESD pulses. In addition, the ESD protection device depicted in FIG. 1 allows the flexibility of choosing the location of the decoupling capacitor within the PCB layout. For example, the decoupling capacitor can be placed close to the IC device 100 to be more effective at stabilizing the supply voltage. Compared to a transient voltage suppressor (TVS) based ESD protection device or a silicon controlled rectifier (SCR) based ESD protection device, the ESD protection device depicted in FIG. 1 uses the NMOS transistor 112 to achieve faster ESD response time and to reduce substrate footprint.

Figure 4:
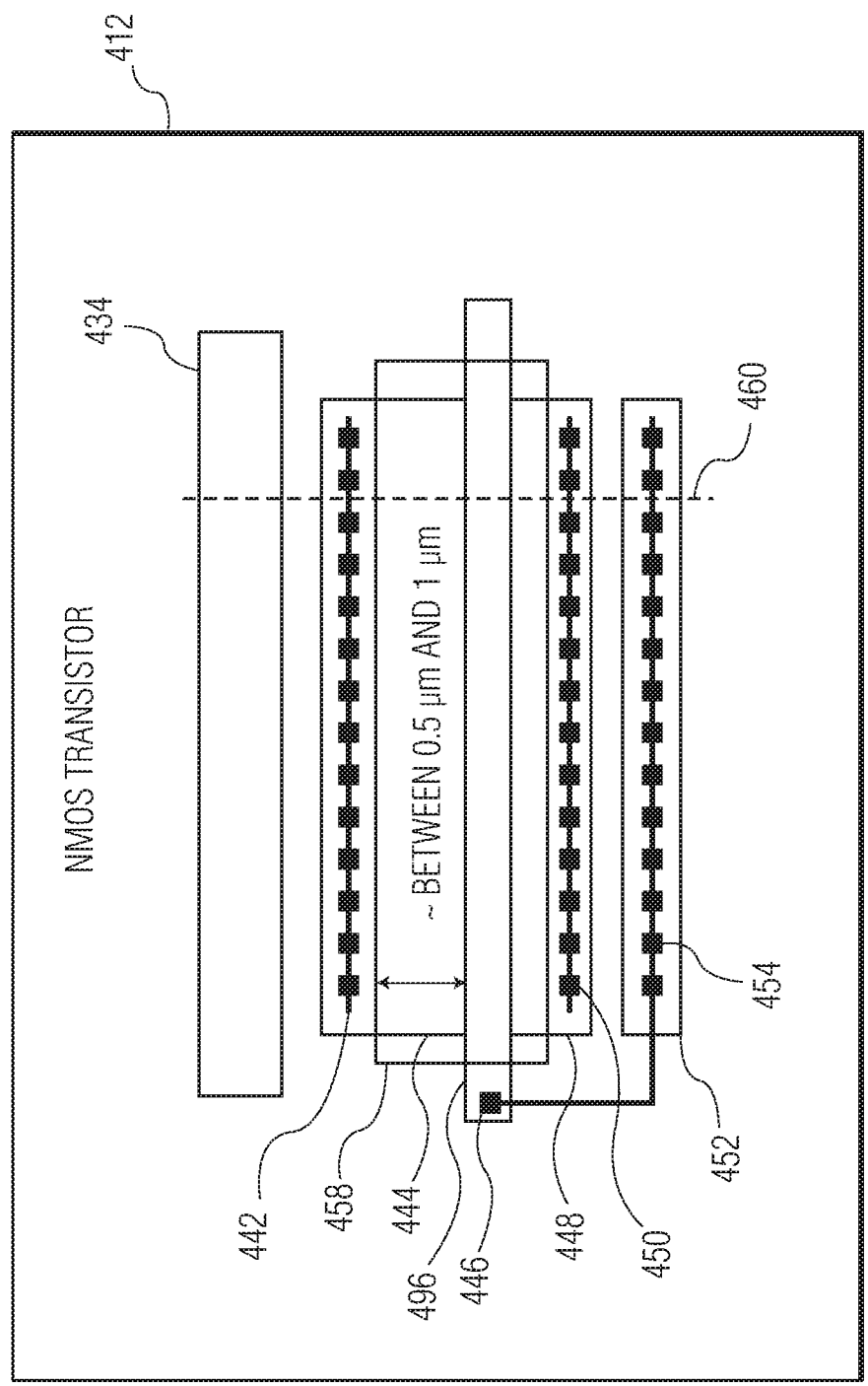
FIG. 4 depicts a top layout view of an NMOS transistor in accordance with an embodiment of the invention.

FIG. 4 depicts a top layout view of an NMOS transistor 412 in accordance with an embodiment of the invention. In the top layout view depicted in FIG. 4, the NMOS transistor includes drain contacts 442, an N+ drain region 444, a gate structure 446, an N+ source region 448, source contacts 450, a P-type body region 452, body contacts 454, and a resistor 434 connected to the gate structure, to the body contacts and to the source contacts. The NMOS transistor 412 depicted in FIG. 4 is a possible implementation of the NMOS transistor 112 depicted in FIG. 1. However, the NMOS transistor 112 depicted in FIG. 1 can be implemented differently from the layout depicted in FIG. 4. For example, although the NMOS transistor 412 is shown in FIG. 4 as including a certain number of N-doped sections and P-doped regions, in other embodiments, the NMOS transistor 412 may include more or less N-doped regions and/or P-doped regions.

In the embodiment depicted in FIG. 4, a silicide block mask 458 covers (e.g., on top of (e.g., in direct contact with)) the N+ drain region 444, the gate structure 446, and the N+ source region 448. The drain ballast resistance of the NMOS transistor 412 may be the equivalent resistance that electrical current encounters when it traverses from the P-type body region 452, through the N+ drain region, to the drain contacts 442. The purpose of having drain ballast resistance in NMOS transistors is to ensure homogeneous current flow within the NMOS transistor. In some embodiments, the drain ballast resistance of the NMOS transistor 412 is a fraction of the drain ballast resistance of a conventional grounded gate NMOS transistor. For example, the drain ballast resistance of the NMOS transistor 412 is about (e.g., 5%) ⅓ or about (e.g., 5%) ⅕ of the drain ballast resistance of a conventional grounded gate NMOS transistor. In some embodiments, the drain ballast resistance of the NMOS transistor can be reduced by reducing the length that the silicide block mask 458 extends from the gate structure into the N+ drain region 444. The reduced drain ballast resistance can lead to a reduction in the voltage at which the NMOS transistor operates during an ESD event. Consequently, the NMOS transistor can provide more effective ESD protection. In addition, silicon area can be saved. For example, the silicide block mask in the NMOS transistor depicted in FIG. 4 can extend less than 1 μm (e.g., between 0.5 μm and 1 μm) from the edge 496 of the gate structure into the N+ drain region 444, while the silicide block mask in a conventional NMOS transistor can extend over 3 μm from the edge of a gate structure into a drain region. Consequently, the size of the silicide block mask and the drain region and the size of the NMOS transistor can be reduced compared to a conventional grounded gate NMOS transistor.

In the embodiment depicted in FIG. 4, the P-type body region 452 of the NMOS transistor 412 is connected to the N+ source region 448 via the resistor 434. In this embodiment, the source contacts 450 and the body contacts 454 are connected via the resistor. The resistance of the resistor can be set to various values. For example, the resistor may have a resistance value of several kΩ. The resistor can promote ESD triggering in the NMOS transistor by the capacitive loading current of the internal body-drain capacitor, rather by impact ionization. In order for the NMOS transistor to carry the ESD current as homogeneously as possible in the presence of a reduced drain ballast resistance, the NMOS transistor should to be triggered homogeneously. Triggering by the loading current of the internal drain-body capacitor tends to be homogeneous across the NMOS transistor.

Figure 5:
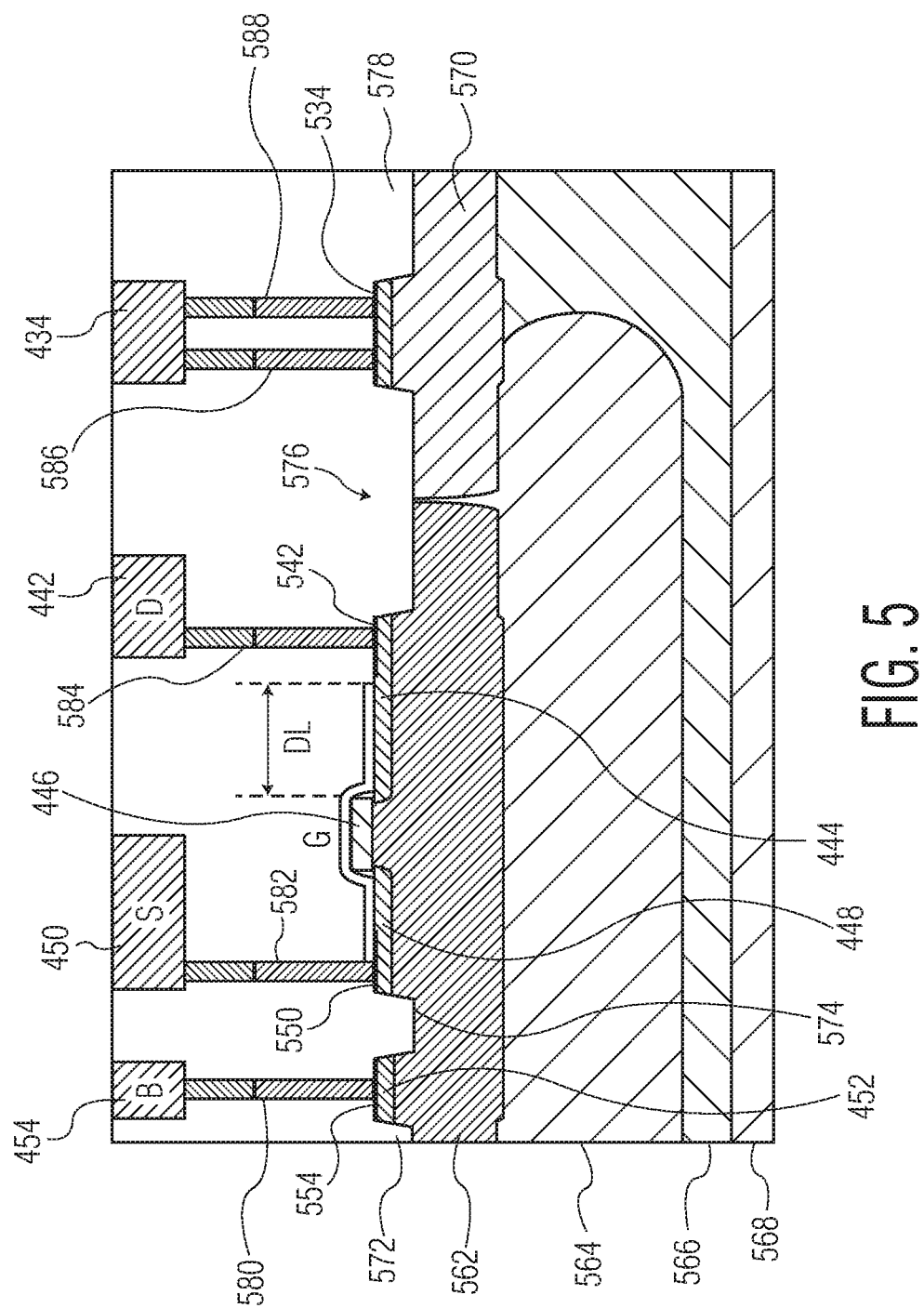
FIG. 5 depicts a cross sectional view of the NMOS transistor depicted in FIG. 4.

FIG. 5 depicts a cross sectional view of the NMOS transistor 412 depicted in FIG. 4 at the location indicated in FIG. 4 by the dashed line 460. In the cross-sectional view of FIG. 5, an isolated P-well region 562 is formed on top of (e.g., in direct contact with) a first N-well/deep N-well region 564. The first N-well/deep N-well region is formed on top of (e.g., in direct contact with) a P-doped epitaxial region 566, which can be an epitaxial film, an epitaxial layer, or any other suitable epitaxial structure. A second N-well/deep N-well region 570 is formed on top of (e.g., in direct contact with) the first N-well/deep N-well region and the P-doped epitaxial region. A contact region 534, which is connected to the resistor 434 through conductive material (e.g., metal connections 586, 588), is formed on top of (e.g., in direct contact with) the second N-well/deep N-well region 570. In some embodiments, a deep N-well region includes a doped layer that is located underneath an N-well. In an embodiment, the depth of a deep N-well region into the substrate region (e.g., the P-doped epitaxial region) is more than the depth of a normal N-well structure. The depth of a deep N-well region into the substrate region (e.g., the P-doped epitaxial region) may be around twice or three times the depth of a normal N-well structure. For example, the depth of a deep N-well region may be around (e.g., ±5%)

1,600 µm while the depth of a normal N-well structure may be around (e.g., ±5%) 600 µm. The deep N-well region can be biased to create a dedicated integrated diode and to enhance the latch-up immunity of nearby circuitry. Because the resistor is formed on the deep N-well region, the trigger voltage of the ESD protection device 104 can be boosted quickly and the ESD reaction time for activating the ESD protection device to shunt ESD current can be reduced.

In the embodiment depicted in FIG. 5, the P-doped epitaxial region 566 is formed on top of (e.g., in direct contact with) a substrate 568, which may be a silicon substrate region. A body contact region 554, a source contact region 550, and a drain contact region 542 are formed on top of (e.g., in direct contact with) the P-type body region 452, the N+ source region 448, and the N+ drain region 444, respectively. The body contact region, the source contact region, and the drain contact region may be low resistance layers (e.g., silicided layers) formed on the surface of the NMOS transistor for better connection with other circuits. The P-type body region 452, the N+ source region 448, the N+ drain region 444, and the gate structure 446 are formed on top of (e.g., in direct contact with) the isolated P-well region 562. The body contact region may be electrically connected to a body contact (e.g., terminal/pin) 454 through conductive material (e.g., a metal connection 580), the source contact region may be electrically connected to a source contact (e.g., terminal/pin) 450 through conductive material (e.g., a metal connection 582), and the drain contact region may be electrically connected to a drain contact 442 (terminal/pin) through conductive material (e.g., a metal connection 584). In the embodiment depicted in FIG. 5, the P-type body region is isolated from (i.e., not in contact with) the substrate and the P-doped epitaxial region. Isolator regions (e.g., shallow trench isolation regions filled with oxide or other isolation material) 572, 574, 576, 578 are formed on top of (e.g., in direct contact with) the isolated P-well region and the second N-well/deep N-well region, respectively.

In the embodiment depicted in FIG. 5, the silicide block mask 458 in the NMOS transistor 412 (FIG. 4) extends less than a predefined length, "DL," from the edge of the gate structure 446 into the N+ drain region 444. The predefined length, DL, may be set to 1 µm or to another suitable value, such as 0.5 µm. For example, the silicide block mask in the NMOS transistor 412 extends between 0.5 µm and 1 µm from the edge of the gate structure 446 into the N+ drain region 444. Consequently, the drain ballast resistance of the NMOS transistor is a fraction of the drain ballast resistance of a conventional NMOS transistor, which leads to a reduction in the voltage at which the NMOS transistor is activated during an ESD event and a reduction in the physical size of the NMOS transistor. Because the ESD trigger voltage is reduced, the NMOS transistor can provide a more effective ESD protection.

Figure 6:
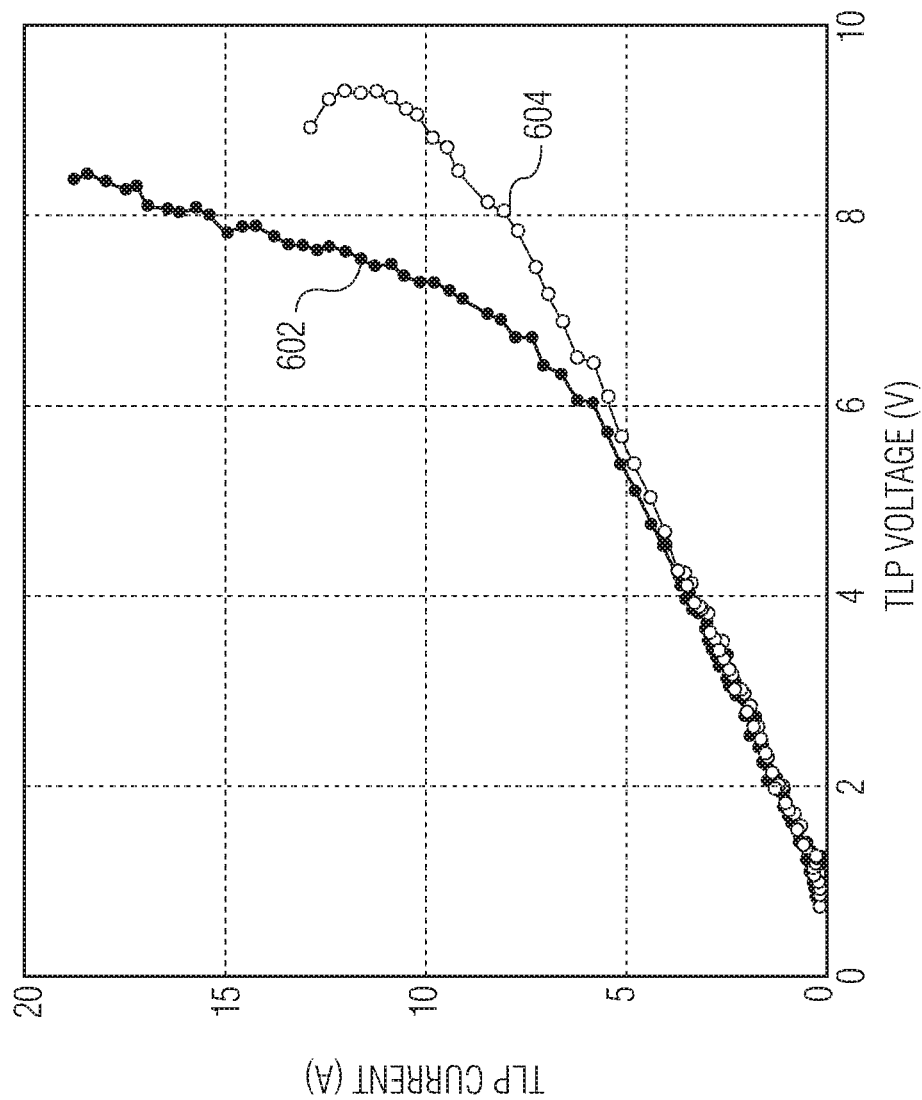
FIG. 6 is a graph of Transmission Line Pulsing (TLP) measurements for an ESD protection device in accordance with an embodiment of the invention and a bigFET.

FIG. 6 is a graph of Transmission Line Pulsing (TLP) measurements for an ESD protection device in accordance with an embodiment of the invention and the bigFET 106 depicted in FIG. 1. TLP is a characterization technique for ESD devices that can send short, high-current pulses through a device under test and measure the resulting current and voltage waveforms via an oscilloscope. For the graph shown in FIG. 6, the TLP measurements are carried out under 2.5 ns pulse. The TLP measurement trace 604 for the bigFET has a fail current of around 11 Å while the TLP measurement trace 602 for the ESD protection device has a higher fail current of around 18 Ampere (A).

Figure 7:
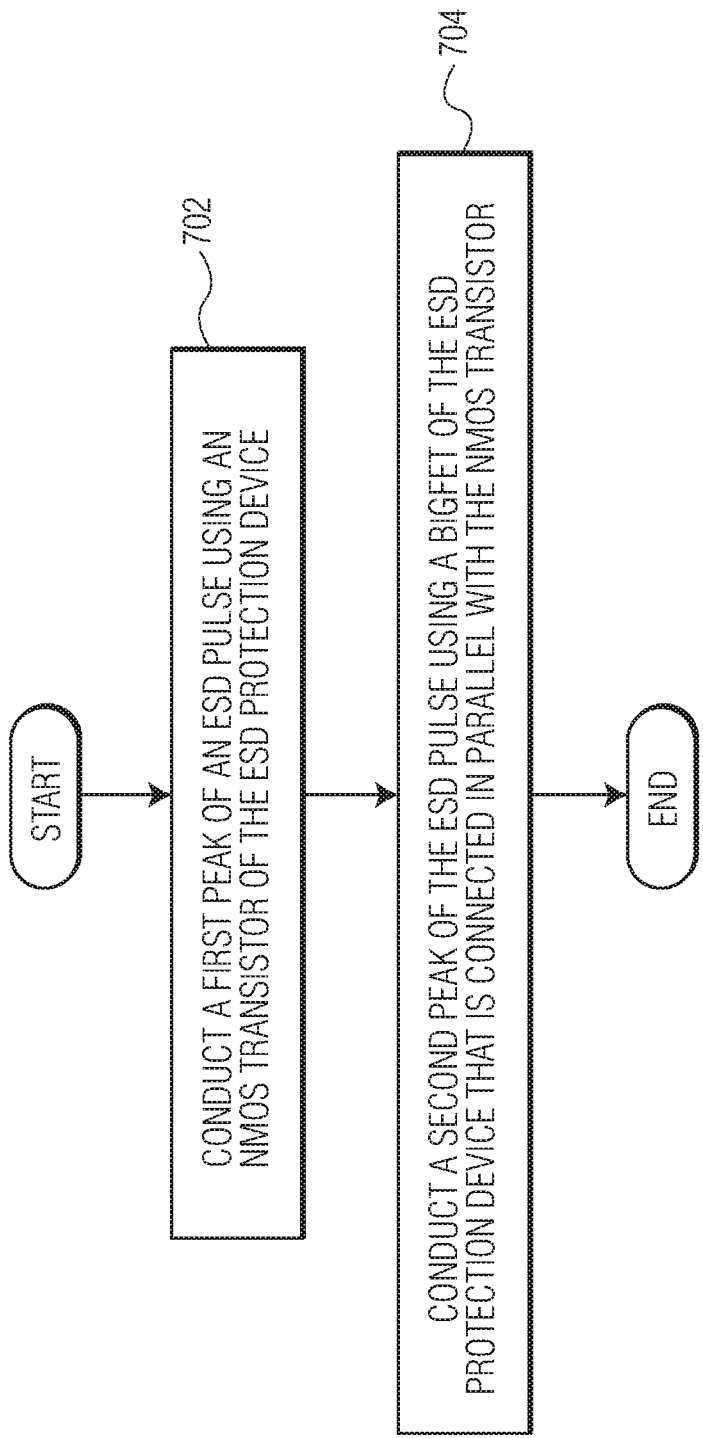
FIG. 7 is a process flow diagram that illustrates a method for operating an ESD protection device in accordance with an embodiment of the invention.

FIG. 7 is a process flow diagram that illustrates a method for operating an ESD protection device accordance with an embodiment of the invention. At block 702, a first peak of an ESD pulse is conducted using an NMOS transistor of the ESD protection device. At block 704, a second peak of the ESD pulse is conducted using a bigFET of the ESD protection device that is connected in parallel with the NMOS transistor. The bigFET may be the same as or similar to the bigFET 106 depicted in FIG. 1. The NMOS transistor may be the same as or similar to the NMOS transistor 112 depicted in FIG. 1 and/or the NMOS transistor 412 depicted in FIGS. 4 and 5.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection device, the ESD protection device comprising:
   an NMOS transistor configured to shunt current in response to an ESD pulse, wherein the NMOS transistor comprises:
      a source terminal;
      a gate terminal; and
      a body, wherein the gate terminal and the body of the NMOS transistor are connected to the source terminal via a resistor; and
   a bigFET connected in parallel with the NMOS transistor, wherein the ESD pulse comprises a first current peak and a subsequent second current peak that is lower than the first current peak, wherein the NMOS transistor is configured to shunt the current during the first peak of the ESD pulse, and wherein the bigFET is configured to conduct ESD current during the second peak of the ESD pulse.

2. The ESD protection device of claim 1, wherein the NMOS transistor and the bigFET are both connected between first and second nodes through which the ESD pulse is received.

3. The ESD protection device of claim 2, wherein the NMOS transistor further comprises a drain terminal connected to the first node, and wherein the source terminal is connected to the second node.

4. The ESD protection device of claim 3, wherein the resistor is connected to the second node.

5. The ESD protection device of claim 2, further comprising a trigger device connected between the first and second nodes and configured to trigger a gate terminal of the bigFET in response to the ESD pulse.

6. The ESD protection device of claim 1, wherein the NMOS transistor further comprises a silicide block mask, and wherein the silicide block mask extends less than a predefined length from the gate terminal to a drain region of the NMOS transistor.

7. The ESD protection device of claim 6, wherein the predefined length is 1 µm.

8. The ESD protection device of claim 1, further comprising a decoupling capacitor connected in parallel with the NMOS transistor.

9. An integrated circuit (IC) device comprising the ESD protection device of claim 1 and a device to be protected connected in parallel with the ESD protection device.

10. An electrostatic discharge (ESD) protection device, the ESD protection device comprising:
   an NMOS transistor configured to shunt current in response to an ESD pulse, wherein the NMOS transistor comprises:
      a source terminal;
      a gate terminal; and
      a body, wherein the gate terminal and the body of the NMOS transistor are connected to the source terminal via a resistor, and wherein the source terminal and the resistor are connected to ground;
   a bigFET connected in parallel with the NMOS transistor; and
   a trigger device configured to trigger a gate terminal of the bigFET in response to the ESD pulse, wherein the ESD pulse comprises a first current peak and a subsequent second current peak that is lower than the first current peak, wherein the NMOS transistor is configured to shunt the current during the first peak of the ESD pulse, and wherein the bigFET is configured to conduct ESD current during the second peak of the ESD pulse.

11. The ESD protection device of claim 10, wherein the NMOS transistor and the bigFET are both connected between first and second nodes through which the ESD pulse is received.

12. The ESD protection device of claim 11, wherein the NMOS transistor further comprises a drain terminal connected to the first node, and wherein the source terminal is connected to the second node.

13. The ESD protection device of claim 10, wherein the NMOS transistor further comprises a silicide block mask, and wherein the silicide block mask extends less than a predefined length from the gate terminal to a drain region of the NMOS transistor.

14. The ESD protection device of claim 13, wherein the predefined length is 1 µm.

15. The ESD protection device of claim 10, further comprising a decoupling capacitor connected in parallel with the NMOS transistor.

16. A method for operating an electrostatic discharge (ESD) protection device, the method comprising:
   conducting a first peak of an ESD pulse using an NMOS transistor of the ESD protection device; and
   conducting a subsequent second peak of the ESD pulse that is lower than the first current peak using a bigFET of the ESD protection device that is connected in parallel with the NMOS transistor.

* * * * *